United States Patent
Kosaki et al.

(10) Patent No.: US 6,245,596 B1
(45) Date of Patent: Jun. 12, 2001

(54) METHOD OF PRODUCING SEMICONDUCTOR DEVICE WITH HEAT DISSIPATION METAL LAYER AND METAL PROJECTIONS

(75) Inventors: Katsuya Kosaki; Masahiro Tamaki; Hiroshi Matsuoka, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/427,584

(22) Filed: Oct. 27, 1999

Related U.S. Application Data

(62) Division of application No. 09/134,331, filed on Aug. 14, 1998, now Pat. No. 6,008,537.

(30) Foreign Application Priority Data

Mar. 19, 1998 (JP) .................................................. 10-070248

(51) Int. Cl.[7] .................................................. H01L 23/24
(52) U.S. Cl. .................. 438/114; 438/114; 438/113; 438/122; 438/462; 438/464; 438/465
(58) Field of Search .................................. 438/122, 114, 438/113, 463, 462, 464, 465; 257/712, 720

(56) References Cited

U.S. PATENT DOCUMENTS

| | | | |
|---|---|---|---|
| 5,200,641 | * 4/1993 | Kosaki | 257/720 |
| 5,275,958 | * 1/1994 | Ishikawa | 438/462 |
| 5,302,554 | * 4/1994 | Kashiwa et al. | 438/17 |
| 5,338,967 | 8/1994 | Kosaki | 257/620 |
| 5,483,092 | * 1/1996 | Kosaki | 257/276 |
| 5,756,237 | * 5/1998 | Amemiya | 430/5 |
| 5,804,908 | 9/1998 | Yano | 313/309 |
| 5,872,396 | 2/1999 | Kosaki | 257/712 |
| 5,998,238 | * 12/1999 | Kosaki | 438/114 |

FOREIGN PATENT DOCUMENTS

| | | |
|---|---|---|
| 8264491 | 10/1996 | (JP) . |
| 10-303198 | * 11/1998 | (JP) . |

\* cited by examiner

*Primary Examiner*—Eddie C. Lee
*Assistant Examiner*—José R. Díaz
(74) *Attorney, Agent, or Firm*—Leydig, Voit & Mayer, Ltd.

(57) ABSTRACT

A method of producing a semiconductor device having a heat dissipating metal layer wherein the number of patterning steps is reduced, laser dicing produces a better profile, and first and second metal layers are prevented from separating from each other, and a semiconductor device produced by the method. The number of patterning steps is reduced by employing a flat exposure step for photoresist with mask alignment. A better appearance is obtained by forming the metal layers which connect the semiconductor devices with each other from a first metal layer having a lower melting point and a second metal layer having a higher melting point and severing the first metal layer and the second metal layer successively, from the first metal layer side. A second metal layer is prevented from peeling by preventing oxidation of the plated feeder layer through plating of the second metal layer.

9 Claims, 7 Drawing Sheets

METHOD OF PRODUCING SEMICONDUCTOR DEVICE WITH HEAT DISSIPATION METAL LAYER AND METAL PROJECTIONS

This disclosure is a division of patent application Ser. No. 09/134,331, filed on Aug. 14, 1998 now U.S. Pat. No. 6,008,537.

BACKGROUND OF THE INVENTION

1. Field of the Invention

The present invention relates to a semiconductor device having a heat dissipation metal layer (PHS: Plated Heat Sink) provided on the back side thereof, and a method of producing the semiconductor device wherein devices are separated by laser cutting.

2. Description of the Related Art

FIG. 3A through FIG. 3k show a method of producing a semiconductor device having a heat dissipation metal layer of the prior art disclosed in PCT application No. JP/96/02758.

According to such a method, a first separation groove 3 is formed by etching the surface of a GaAs substrate 1, on which semiconductor elements have been formed in advance, by using a photoresist layer 2 as a mask (FIG. 3A), then a first metal layer is formed in the first separation groove 3 by plating or another process (FIG. 3B).

Then the GaAs substrate 1 is coated with a wax 5 and is bonded onto a carrier substrate 6 such as glass plate or sapphire plate, with the GaAs substrate 1 being polished on the back side to reduce the thickness thereof to about 20 to 30 $\mu$m (FIG. 3C).

Next, a photoresist layer 14 is formed on the back side of the GaAs substrate 1 in a first patterning step so that an opening is provided on the back of the first separation groove 3 (FIG. 3D). The back side of the GaAs substrate 1 is etched by using the photoresist layer 14 as a mask until the bottom of a metal layer 4 in the first separation groove is exposed, thereby forming a second separation groove 33 (FIG. 3E).

Then, after removing the photoresist layer 14, a plated feeder layer 7 is formed over the entire back surface of the GaAs substrate 1 (FIG. 3F). A second metal layer 16 made of the same metal as the first metal layer is formed in the second separation groove 33 by plating, using a photoresist layer 15 formed in a second patterning step as a mask (FIG. 3G).

Then, a photoresist layer 17 having a width smaller than that of the second separation groove 33 is formed in the second separation groove 33, using a third patterning step, and a gold PHS layer 8 is formed on the back side by an electrolytic plating method, using the photoresist layer 17 as a mask (FIG. 3H). The GaAs substrate 1 is then separated from the carrier substrate 6 (FIG. 2I) and an expand film 10 is attached to the PHS layer 8 (FIG. 3J).

Finally, the first and the second metal layers in the first separation groove are severed in the first separation groove 3 side by laser cutting operation using YAG laser or the like, thereby separating the elements to obtain a semiconductor device forming the fused metal mass 12 at the periphery of the semiconductor device (FIG. 3K).

According to the method of producing the semiconductor device as described above where the semiconductor devices connected with each other by means of the first and the second metal layers are separated by laser cutting of the metal layers, since the semiconductor elements are connected with each other by the two metal layers, the connection are resistant to bending and cracking during the producing process, while deposition of foreign matters on the element surface and defective appearance of the elements can be reduced thereby improving the production yield of the semiconductor devices, compared to a method of separating devices by dicing.

In the conventional method, three patterning steps are required from the first through the third patterning steps after the polishing step in which the GaAs substrate 1 is turned into a thin film of about 20 to 30 $\mu$m in thickness. In case the patterning steps are carried out a plurality of times, the wax 5 softens due to the heat generated during baking in the patterning processes and removal of photoresist, thus causing thermal stresses in the GaAs substrate 1 and mechanical stresses in the GaAs substrate 1 during contact exposure, thereby making cracks or other defects likely to occur in the GaAs substrate 1. Thus there has been a limitation to the improvement in the production yield and it has been difficult to reduce the production costs due to the complicated producing process.

While the use of the two metal layers has an advantage that bending and cracking of the metal layer can be reduced during the production steps, the thick film may cause poor appearance of the cut portion and the generation of devices having poor appearance has been impeding the improvement in the production yield.

There has also been such a problem that the first metal layer and the second metal layer peel off each other when the second metal layer is formed in an electrolytic plating process.

SUMMARY OF THE INVENTION

Hence, an object of the present invention is to provide a method of producing a semiconductor device wherein number of patterning processes is reduced, laser cutting produces a better profile, while the first and the second metal layers are prevented from separating from each other, and a semiconductor device produced by the method.

Hence, the present inventors have found the followings thereby accomplishing the present invention. First, the number of patterning steps can be reduced by employing flat exposure step for photoresist without carrying out mask alignment. Second, better profile can be obtained by forming the metal layer which connects semiconductor devices with each other from the first layer of metal having a low melting point and the second layer of metal having a high melting point, and cutting off the first metal layer and the second metal layer successively from the first metal layer side. Third, the second metal layer can be prevented from peeling off by preventing the oxidation of a plated feeder layer in the step of plating the second metal layer.

The present invention provides a method of producing a semiconductor device, which comprises forming a first separation groove and a first metal layer covering the surface of the first separation groove on the surface of a semiconductor substrate; thinning the semiconductor substrate from the back surface thereof; forming a second separation groove wherein the first metal layer is exposed and a second metal layer covering the surface of the second separation groove on the back side of the first separation groove; and cutting off the first metal layer and the second metal layer from the first metal layer side by means of laser; wherein the second separation groove is formed by etching the semiconductor substrate until the first metal layer is exposed by using the heat dissipating metal layer formed in a region of the back surface of the semiconductor substrate except for the back surface of the first separation groove as a mask, and that the first metal layer and the second metal layer have a reflectivity of 80% or lower for the laser light.

Having the reflectivity of 80% or lower for the laser light makes it possible to keep the decrease in the efficiency of laser cutting due to the reflection of laser light to such an extent that is acceptable in practice.

The melting point of the second metal layer is preferably higher than that of the first metal layer.

This is because it is made possible that the two metal layers connecting the semiconductor devices with each other are cut off one by one by means of laser beam and, even when the total thickness of the two metal layers is large, cut face of the metal layer which has been cut off by the laser beam can be made in a favorable linear profile thereby preventing the decrease of production yield due to defective appearance.

The second metal layer is preferably formed in such a process as: after the second metal layer is formed to cover the second separation groove surface and the heat dissipating metal layer surface, a photoresist, applied over the entire surface of the second metal layer in such a way that the second separation groove is embedded, is removed by exposing the entire surface so that the portion of photoresist filling the second separation groove remains, and the second metal layer located on the heat dissipation metal layer is removed by using the photoresist layer as a mask while leaving the second metal layer in the second separation groove to remain thereon, and then removing the photoresist layer.

By using such a metal layer forming step as described above, the number of patterning steps accompanied by the mask alignment can be made less than that in the conventional step, and occurrence of chipping and crack of the semiconductor substrate in the patterning step can be prevented, thereby improving the production yield.

Also as the number of steps is reduced, production cost can be decreased.

It is preferable to form a thin film of Ti and a film of Au successively to cover the second metal layer after the second metal layer has been formed to cover the second separation groove surface and the heat dissipating metal layer surface.

Use of the metal layer forming step described above makes the flat exposure step of the photoresist layer unnecessary, and accordingly makes it possible to reduce the number of producing steps, thereby reducing the production cost.

It is also preferable to form the plated feeder layer and the Au plating thin film to cover at least the second separation groove surface after forming the second separation groove, and form the second metal layer on the Au plating layer by using the plated feeder layer in electrolytic plating step.

It is because, although surface oxidation of the plated feeder layer causes a problem when forming the second metal layer in the electrolytic plating step, oxidation of surface of the plated feeder layer in the electrolytic plating process of the second metal layer can be prevented by covering the plated feeder layer surface with an inert Au thin film. This improves the bonding performance of the first metal layer and the second metal layer, thereby improving the reliability of the semiconductor device.

The thickness of the thin Au plating layer is preferably from 500 to 5000 Å.

It is because the Au plating layer is formed also in the portion to be cut by laser beam, and therefore a film having a thickness of 5000 Å or greater is difficult to cut due to the reflection of laser light.

When the thickness is less than 500 Å, the film is difficult to function as an anti-oxidation film for the plated feeder layer.

The thickness of the thin Au plating layer is more preferably from 500 to 1000 Å.

The first metal layer and the second metal layer are preferably formed from a metal, which reflects not greater than 8% of the laser light used in laser cutting.

It is because the efficiency of laser cutting can be improved and it is made possible to cut off the metal layer without increasing the laser output. Also because the laser beam of excessively high output cuts off the expand sheet bonded onto the bottom surface of the PHS layer which should not be cut.

It is preferable that the first metal layer and the plated feeder layer be formed from a Ni alloy selected from Ni—P, Ni—B and Ni—B—W and the second metal layer is formed from Ni or Cr.

The present invention also provides a semiconductor device comprising a semiconductor substrate on which semiconductor elements are formed; a heat dissipation metal layer formed on the back surface of the semiconductor substrate; and a metal layer covering the side face of the semiconductor substrate and having a flange-shaped projection; wherein the projection has a laminated structure made of at least a first metal layer, a plated feeder layer and an Au plating layer which are successively formed on the back surface of the first metal layer, and a second metal layer plated on the Au plating layer by using the plated feeder layer.

The melting point of the second metal layer is preferably higher than that of the first metal layer.

It is preferable that the first metal layer and the plated feeder layer are formed from a Ni alloy selected from Ni—P, Ni—B and Ni—B—W and the second metal layer be formed from Ni or Cr.

It is also preferable that at least the second metal layer, a thin Ti layer and a thin Au layer are laminated alternately on the surface of the heat dissipation metal layer.

As will be clear from the above description, the method of the present invention is capable of making the end face of the metal layer which has been cut off by laser in a favorable linear profile by cutting the two metal layers, which connect the semiconductor devices with each other, one by one, and is therefore capable of preventing the decrease of production yield due to defective appearance.

Also by using the flat exposure of photoresist to reduce the number of patterning steps accompanied by mask alignment, faults such as chipping of the semiconductor substrate experienced during such patterning steps can be prevented from occurring, thereby making it possible to improve the production yield and reduce the production cost through the reduction of the producing processes.

Further, wettability of the AuSn solder with the PHS layer can be improved, thus improving the reliability of the semiconductor device.

By covering the plated feeder layer surface with an inert thin Au film when forming the second metal layer by electrolytic plating method, the surface of the plated feeder layer can be prevented from being oxidized during the electrolytic plating step, thereby improving the bonding performance of the first metal layer and the second metal layer, resulting in improved reliability of the semiconductor device.

DESCRIPTION OF THE PREFERRED EMBODIMENTS

EMBODIMENT 1

Figure 1A:
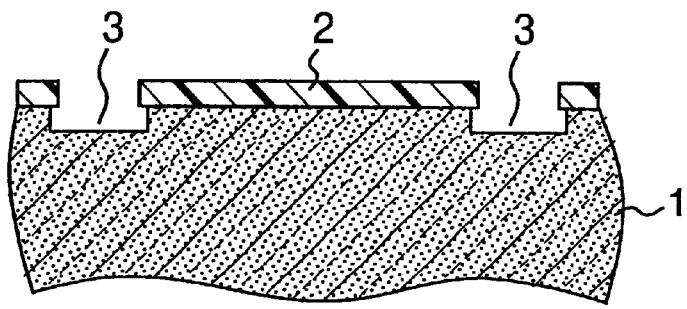
FIGS. 1A–1L show a producing process for a semiconductor device according to the first embodiment of the present invention.
Figure 1B:
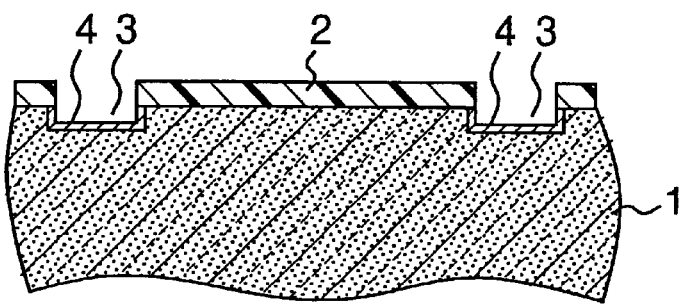

A method of producing semiconductor devices according to the first embodiment of the present invention will now be described below with reference to FIGS. 1A through FIG. 1L. Reference numerals identical with those used in FIGS. 3A through FIG. 3k denote the same or corresponding components.

According to the first embodiment of the method of present invention, a first separation groove is formed on the surface of a GaAs substrate 1 having semiconductor elements formed thereon in an etching step using a photoresist layer 2 as a mask (FIG. 1A). Then, a first metal layer 4 is formed in the first separation groove by vapor deposition, sputtering, non-electrolytic plating method, or the like (FIG. 1B), in the steps similar to those of the prior art. The first metal layer 4 is preferably a Ni alloy layer selected from Ni—P, Ni—B and Ni—B—W.

While the first metal layer 4 has a reflectivity for YAG laser light used in laser cutting preferably less than about 80%, a more preferable value of reflectivity within 8% can be obtained by increasing the content of Ni.

Figure 1C:
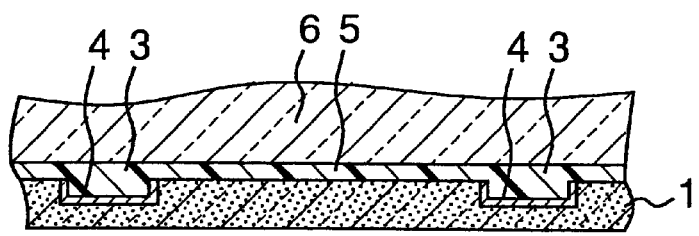
Figure 1D:
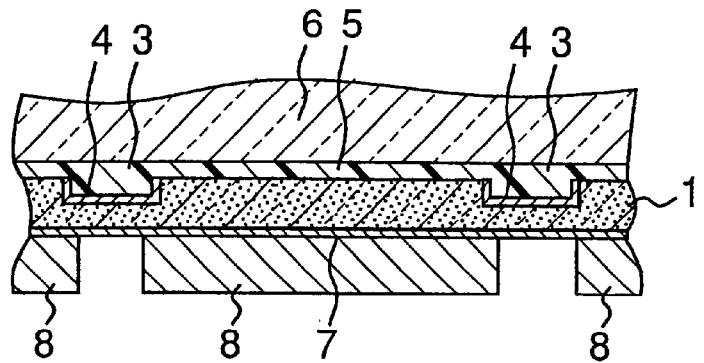

Then a GaAs substrate 1 is coated with a wax 5 on the surface thereof and is bonded onto a carrier substrate 6 such as a glass plate or a sapphire plate, with the GaAs substrate 1 being polished on the back side to reduce the thickness to about 20 to 30 $\mu$m (FIG. 1C).

Next, a plated feeder layer 7 is formed over the entire back surface of the semiconductor substrate 1 by vapor, sputtering deposition, non-electrolytic plating, or the like as shown in (FIG. 1D), and a photoresist layer (not shown) is formed in a region corresponding to the back side of the first separation groove 3. The photoresist layer is then used as a mask to form a PHS layer 8 of thickness from about 30 to 40 $\mu$m made of Au or Cr on the plated feeder layer 7 in an electrolytic method, and then the photoresist layer is removed.

According to this embodiment, the number of patterning steps wherein mask alignment is necessary after thinning the GaAs substrate 1 is only the one described above.

Figure 1E:
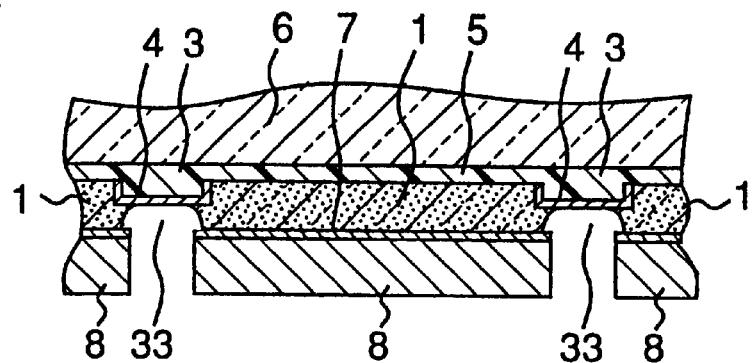

Then back side of the GaAs substrate 1 is etched by using the PHS layer 8 as a mask until the bottom of the metal layer 4 in the first separation groove 3 is exposed, thereby forming a second separation groove 33 (FIG. 1E).

Figure 1F:
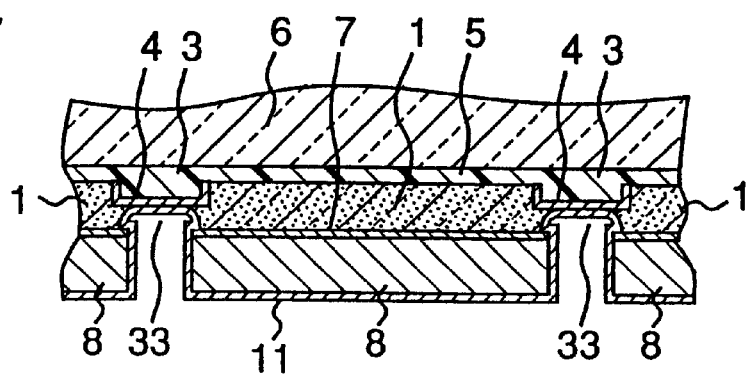

Then, as shown in FIG. 1F, a Ni alloy layer selected from Ni—P, Ni—B and Ni—B—W is formed by non-electrolytic plating on the surface of the PHS layer 8 and the surface (entire back surface) of the second separation groove 33, thereby making a second feeder layer (not shown). This is followed by the formation of an Au film (not shown) of thickness from about 500 to 5000 Å, more preferably from about 500 to 1000 Å, to cover the second feeder layer in, substituting Au non-electrolytic plating. The Au film is formed consecutively following the formation of the second feeder layer. This prevents the surface of the second feeder layer from being oxidized in the second metal layer 11 plating step that follows, thus making it possible to improve the bonding strength between the second feeder layer and the second metal layer 11.

In case the second feeder layer is formed from Ni—P or the like, for example, an oxidation film is formed on the surface of the second feeder layer in the plating step of the second metal layer 11, causing a decrease in the bonding strength between the second feeder layer and the second metal layer 11. Such a decrease in the bonding strength can be prevented by forming the stable Au film which prevents the oxidation.

Subsequently, the second metal layer 11 is formed by electrolytic plating by using the second feeder layer, the second metal layer 11 having a melting point higher than that of the first metal layer 4 (a Ni alloy layer selected from Ni—P, Ni—B and Ni—B—W) and reflectivity for YAG laser light less than about 80%, or preferably within 8%.

The second metal layer 11 is preferably made of, for example, Ni or Cr. When Ni is used, in particular, the reflectivity for YAG laser light used in laser cutting can be decreased to less than about 8%.

The total thickness of the first metal layer 4 and the second metal layer 11 is preferably set within a range from about 0.5 to 50 $\mu$m in consideration of the strength and ease of cutting.

Figure 1G:
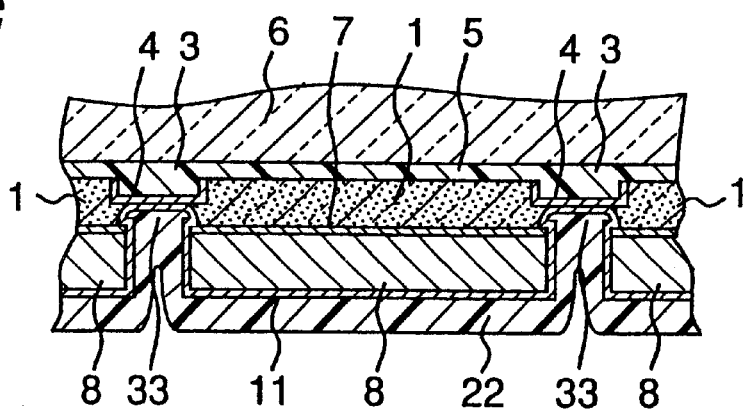
Figure 1H:
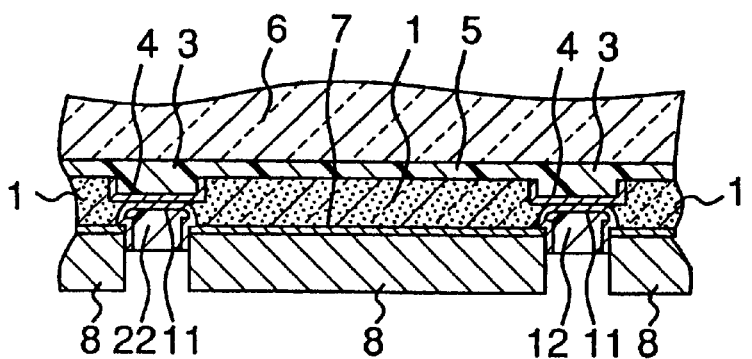

Then, as shown in FIG. 1G, after coating the back side of the semiconductor substrate 1 with a positive type photoresist 22 to fill the second separation groove 33, the entire surface is exposed to light. The photoresist 22 is applied by spin coating or a similar technique, in the second separation groove 33 to form a thick film as shown in FIG. 1G. The photoresist 22 is exposed to light over the entire surface so that the photoresist 22 on the second metal layer 11 is exposed but the thick photoresist 22 in the second separation groove 33 is not exposed. Thus only the portion of the photoresist 22 provided in the second separation groove 33 can remain as shown in FIG. 1H by developing and removing the exposed photoresist 22.

In the exposure step described above, it is not necessary to align the mask and mechanical stress is not caused in the semiconductor substrate 1, thereby making it possible to prevent breakage and cracking of the GaAs substrate 1 from occurring.

Figure 3A:
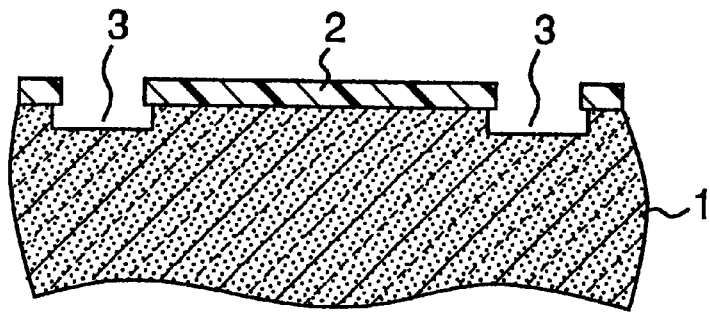
FIG. 3A–3K shows a producing process for a semiconductor device of the prior art.
Figure 3B:
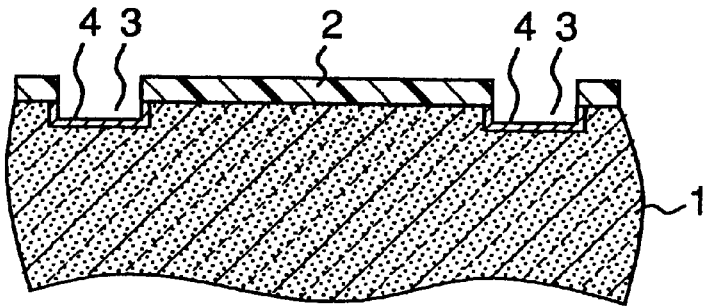
Figure 3C:
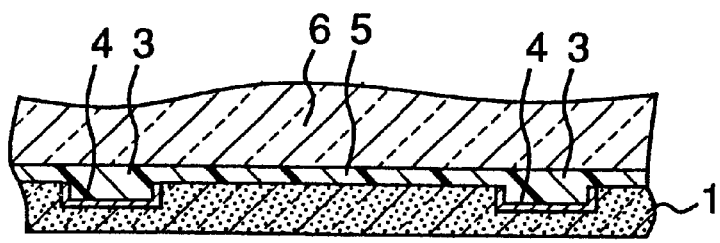
Figure 3D:
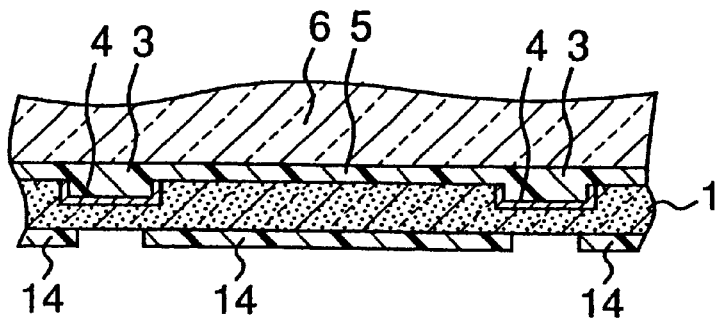
Figure 3E:
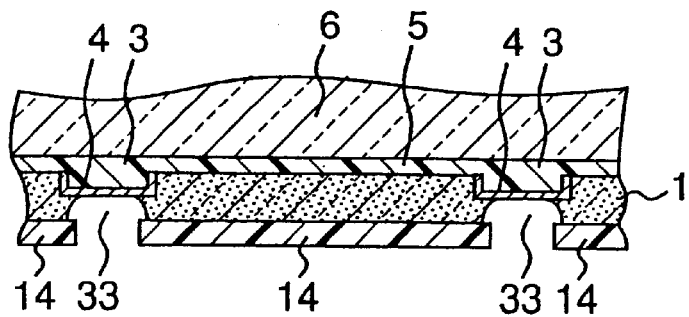
Figure 3F:
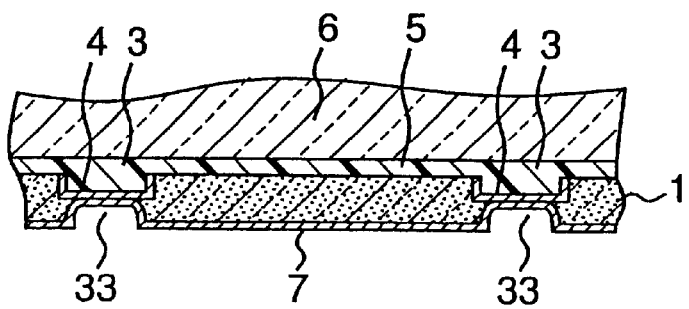
Figure 3G:
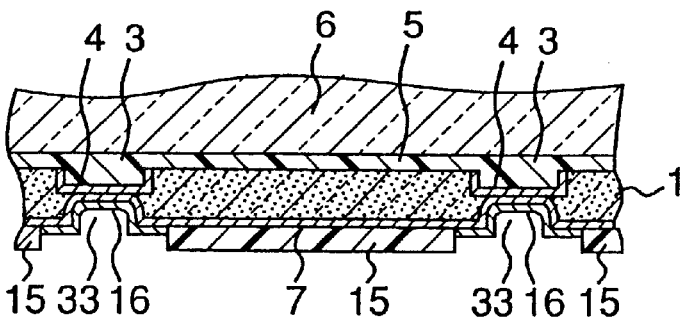
Figure 3H:
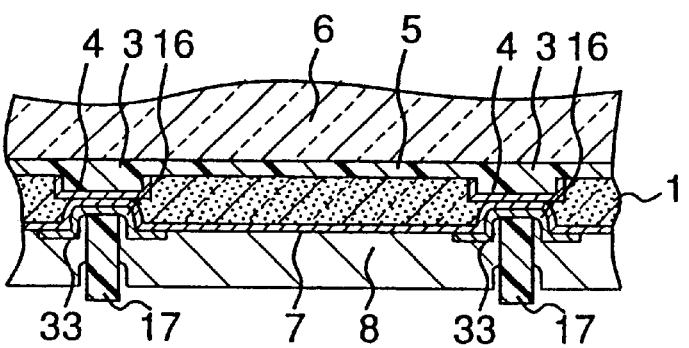
Figure 3I:
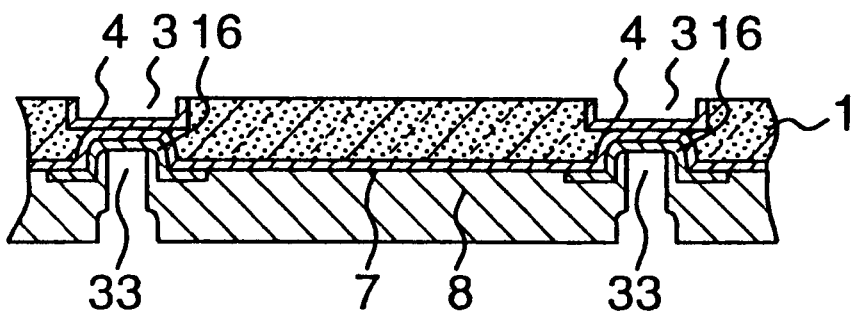
Figure 3J:
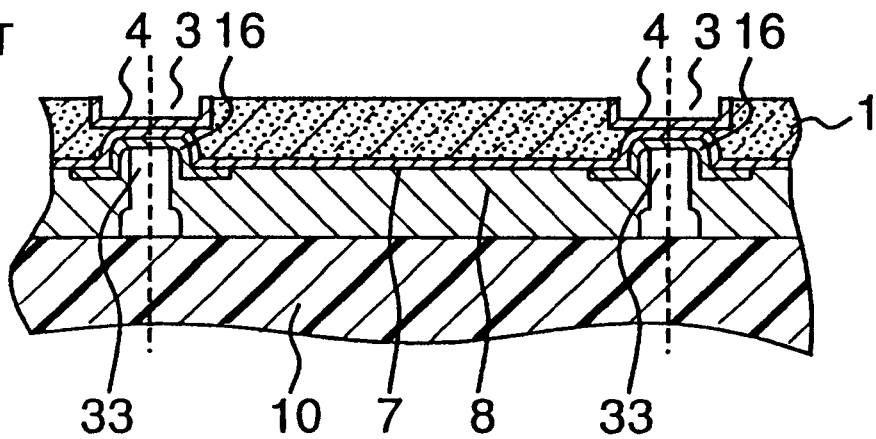
Figure 3K:
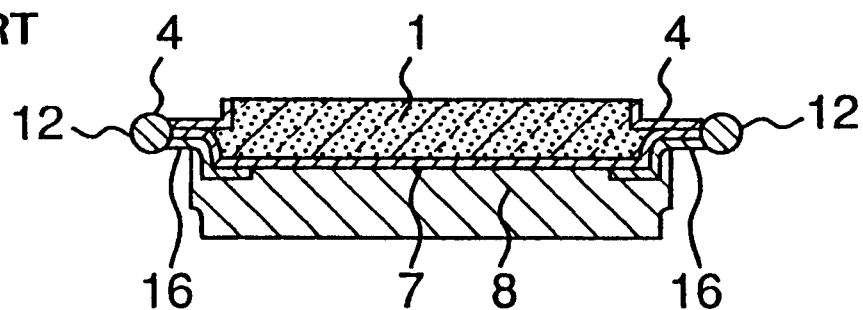

Then, as shown in FIG. 3I, the second metal layer 11 is removed by ion milling or etching with the photoresist 22 remaining in the second separation groove 33 as a mask, thus leaving the second metal layer 11 remaining only in the second separation groove 33 and in the vicinity thereof.

Figure 1I:
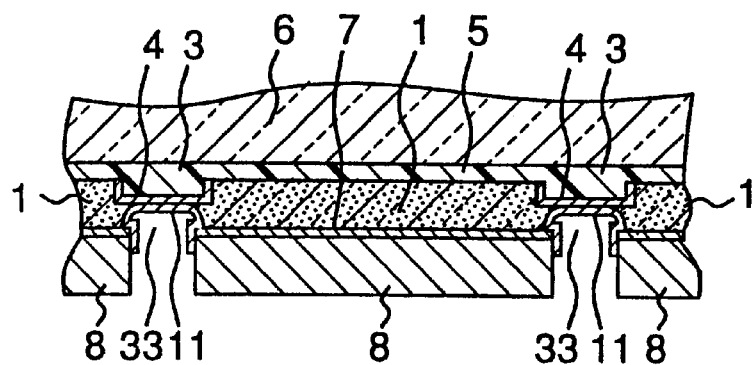
Figure 1J:
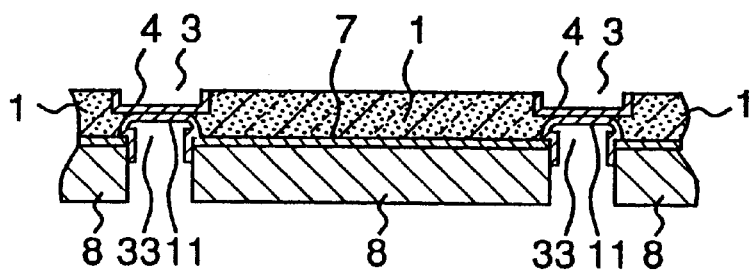

While FIG. 1I shows a case of leaving the second metal layer 11 in the second separation groove 33 and on a part of the PHS layer 8, it suffices to leave the second metal layer 11 at least to cover the surface of the second separation groove 33.

Finally, the photoresist 22 remaining in the second separation groove 33 is dissolved and removed by using acetone or the like.

Then, as in the method of the prior art, the GaAs substrate 1 is separated from the carrier substrate 6 as shown in FIG.

Figure 1K:
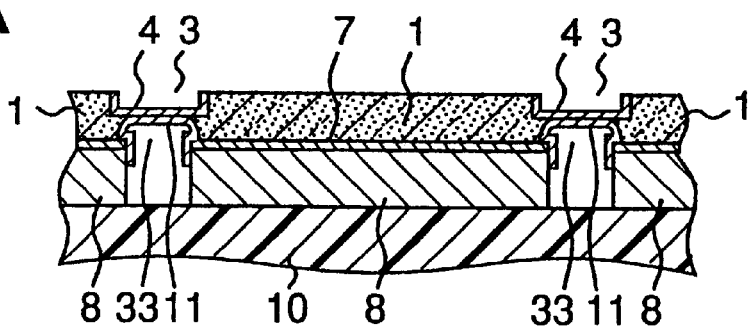

1J with the wax 5 being removed by using an organic solvent or the like, and an expand film 10 is attached to the PHS layer 8 on the back of the GaAs substrate 1 as shown in FIG. 1K.

A YAG laser beam irradiates the first chip separation groove 3 on the front side of the GaAs substrate 1 thereby to sever the first metal layer 4 and the second metal layer 11 forming the fused metal mass 12 at the periphery of the of the semiconductor device.

As described above, the first metal layer 4 is made of a Ni alloy layer selected from Ni—P, Ni—B and Ni—B—W and the second metal layer 11 is made of, for example, Ni or Cr. A case of using Ni-8-10 wt % P alloy (melting point: 890° C.) as the first metal layer 4 and using Ni (melting point: 1450° C.) as the second metal layer 11 will be described below.

The metal layers 4, 11 are severed by laser cutting by using, for example, a YAG laser. The total thickness of the first metal layer 4 and the second metal layer 11 is from about 0.5 to 50 $\mu$m. When the thickness of the layers are larger than the above, a defective appearance may be caused in the cut face of laser cutting.

According to this embodiment, because the material of the first metal layer 4 is selected to have a melting point lower than that of the second metal layer 11, the first metal layer 4 is cut first, and the second metal layer 11 is cut next in the laser cutting method.

Consequently, because the metal layers 4, 11 are cut with the thickness thereof being relatively thin, a defective appearance caused in the cut face which has been occurring with thick metal layers can be eliminated, thereby making it possible to improve the production yield.

When a Ni-8-10 wt % P alloy is used as the first metal layer 4 and Ni is used as the second metal layer 11, reflectivity of the metal layers 4, 11 for the YAG laser light can be decreased to less than 8%. While it is necessary to keep the reflectivity within 80%, a level of reflectivity less than 8% makes it possible to carry out laser cutting of a high efficiency.

When the reflectivity is high, it is necessary to increase the output energy of the YAG laser which leads to cutting of the expand film 10 attached to the back side of the PHS layer 8, thereby completing the semiconductor elements out of order, giving rise to such troubles as chipping of the elements as they hit each other.

Figure 1L:
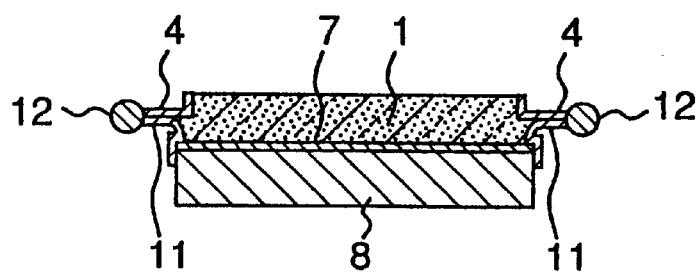

Finally, separating the semiconductor elements from the expand film 10 produces the semiconductor devices as shown in FIG. 1L.

In the semiconductor device produced by the method according to this embodiment, as shown in FIG. 1L, the metal layers 4, 11 which have been cut by laser light can have a better appearance with a rounded profile.

Also because the number of patterning steps accompanying mask alignment to be carried out after thinning the GaAs substrate 1, which have been done three times in the prior art, can be reduced to one, faults such as breakage and cracking of the GaAs substrate 1 experienced during such operations can be prevented from occurring.

Also because the second metal layer 11 such as Ni on the PHS layer 8 is selectively removed and the surfaces (bottom and side) of the PHS layer 8 made of Au are exposed, wettability with the AuSn solder commonly used in die bonding step can be improved.

EMBODIMENT 2

Figure 2A:
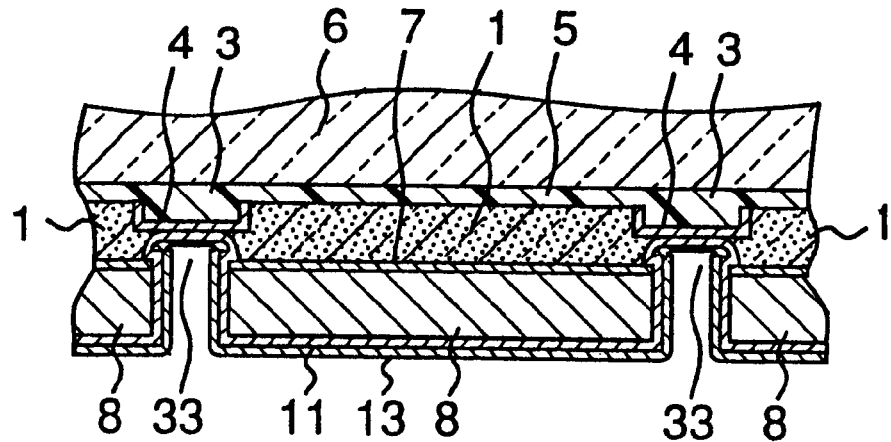
FIGS. 2A–2C show a producing process for the semiconductor device according to the second embodiment of the present invention.

A second embodiment of the present invention will now be described below with reference to FIGS. 2A–2C. Reference numerals in the drawing identical with those used in FIGS. 1A through FIG. 1L denote the same or corresponding components.

First the processes shown in FIGS. 1A through FIG. 1F of the first embodiment are carried out to form the second metal layer 11 made of Ni or the like on the surface of the PHS layer 8 and the surface (entire surface on the back side) of the second separation groove 33.

Subsequently, a thin Ti film having a thickness of about 0.05 $\mu$m and a thin Au film having a thickness of about 0.2 to 0.3 $\mu$m are formed successively on the entire surface, covering the second metal layer 11, by sputtering or vapor deposition, thereby making a Ti/Au layer 13. At this time, because the Ti/Au layer 13 is formed on the side face of the PHS layer 8 as well, wettability of the back surface and side faces of the PHS layer 8 with the AuSn solder can be improved during die bonding to the PHS layer 8.

Figure 2B:
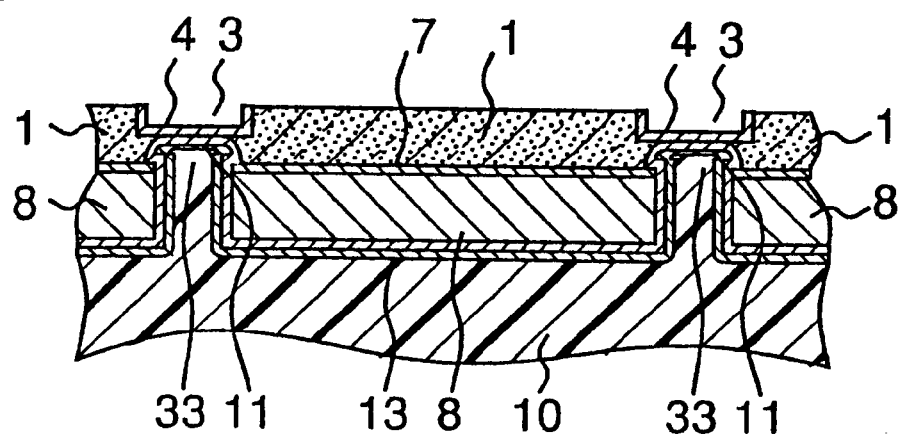

Then as in the case of the first embodiment, the GaAs substrate 1 is separated from the carrier substrate 6 as shown in FIG. 2B with the bonding wax 5 being removed by using an organic solvent or the like, and the expand film 10 is attached to the back of the GaAs substrate 1.

Figure 2C:
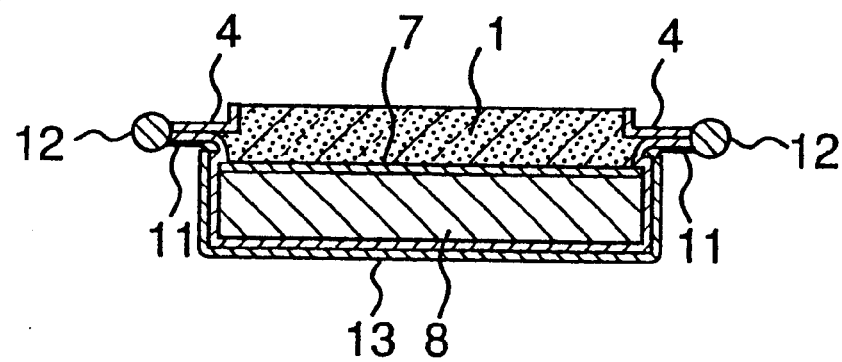

Finally, a YAG laser beam irradiates from above the first separation groove 3 to sever the first metal layer 4 and the second metal layer 11 thereby to separate the GaAs substrate 1 into individual semiconductor elements forming the fused metal mass 12 at the periphery of the semiconductor device and, by separating the individual semiconductor elements from the expand film 10, the semiconductor device as shown in FIG. 2C is obtained.

In the semiconductor device produced by the method according to this embodiment, as shown in FIG. 2C, the metal layers 4, 11 which have been cut by laser can be rendered better in appearance with a rounded profile, similar to the semiconductor device manufactured according to the first embodiment.

Further, the flat exposure step for the photoresist shown in FIG. 1G can be eliminated, thus making the process simpler.

Although the second metal layer 11 formed on the PHS layer 8 from Ni or the like is not removed in this embodiment, the Ti/Au layer 13 is formed on the second metal layer 11 which improves the wettability of the back surface and side faces of the PHS layer 8 with the AuSn solder during die bonding to the PHS layer 8.

Although the first and second embodiments have been described for cases where the GaAs substrate is used, the present invention may also be applied similarly to semiconductor substrates other than GaAs substrates, such as those made of, for example, Si, InP and GaN.

What is claimed is:

1. A method of producing a semiconductor device comprising:

forming a first separation groove in a semiconductor substrate at a front surface of the semiconductor substrate;

depositing a first metal layer in the first separation groove on the semiconductor substrate;

thinning the semiconductor substrate from a back surface of the semiconductor substrate;

forming a heat dissipating metal layer on the back surface of the semiconductor substrate except on a part of the back surface opposite the first separation groove;

using the heat dissipating metal layer as a mask, etching a second separation groove in the back surface of the semiconductor substrate, exposing the first metal layer;

depositing a second metal layer in the second separation groove on the first metal layer, wherein the melting point of the second metal layer is higher than the melting point of the first metal layer; and successively severing the first metal layer and the second metal layer by means of laser light wherein the first metal layer and the second metal layer have a reflectivity of no more than 80% for the laser light.

2. The method as claimed in claim 1, including:

forming the second metal layer in the second separation groove and on the heat dissipating metal layer;

applying a photoresist covering the second metal layer and filling the second separation groove;

removing a portion of the photoresist, leaving the photoresist filling the second separation groove;

removing the second metal layer from the heat dissipating metal layer, using the photoresist filling the second separation groove as a mask, so that the second metal layer is left in the second separation groove; and removing all photoresist.

3. The method as claimed in claim 1, wherein the first metal layer and the second metal layer reflect more than 8% of the laser light in laser severing.

4. The method as claimed in claim 1, wherein the first metal layer is a Ni alloy selected from the group consisting of Ni—P, Ni—B, and Ni—B—W, and the second metal layer is one of Ni and Cr.

5. A method of producing a semiconductor device including:

forming a first separation groove in a semiconductor substrate at a front surface of the semiconductor substrate;

depositing a first metal layer in the first separation groove on the semiconductor substrate;

thinning the semiconductor substrate from a back surface of the semiconductor substrate;

forming a heat dissipating metal layer on the back surface of the semiconductor substrate except on a part of the back surface opposite the first separation groove;

using the heat dissipating metal layer as a mask, etching a second separation groove in the back surface of the semiconductor substrate, exposing the first metal layer;

depositing a second metal layer in the second separation groove on the first metal layer;

forming a film of Ti and a film of Au successively, covering the second metal layer and the heat dissipating metal layer; and successively severing the first metal layer and the second metal layer by means of laser light wherein the first metal layer and the second metal layer have a reflectivity of no more than 80% for the laser light.

6. A method of producing a semiconductor device including:

forming a first separation groove in a semiconductor substrate at a front surface of the semiconductor substrate;

depositing a first metal layer in the first separation groove on the semiconductor substrate;

thinning the semiconductor substrate from a back surface of the semiconductor substrate;

forming a heat dissipating metal layer on the back surface of the semiconductor substrate except on a part of the back surface opposite the first separation groove;

using the heat dissipating metal layer as a mask, etching a second separation groove in the back surface of the semiconductor substrate, exposing the first metal layer;

plating a feeder layer and an Au film in at least the second separation groove;

depositing a second metal layer on the Au film, using the feeder layer, by electrolytic plating, in the second separation groove, wherein the feeder layer is a Ni alloy selected from the group consisting of Ni—P, Ni—B, and Ni—B—W, and successively severing the first metal layer and the second metal layer by means of laser light wherein the first metal layer and the second metal layer have a reflectivity of no more than 80% for the laser light.

7. The method as claimed in claim 6, wherein the thickness of the Au film is from 500 to 5000 Å.

8. The method as claimed in claim 6, wherein the thickness of the Au film is from 500 to 1000 Å.

9. The method as claimed in claim 6, wherein the first metal layer is a Ni alloy selected from the group consisting of Ni—P, Ni—B, and Ni—B—W, and the second metal layer is one of Ni and Cr.

* * * * *